United States Patent
Wu

(10) Patent No.: US 6,316,316 B1
(45) Date of Patent: *Nov. 13, 2001

(54) METHOD OF FORMING HIGH DENSITY AND LOW POWER FLASH MEMORIES WITH A HIGH CAPACITIVE-COUPLING RATIO

(75) Inventor: Shye-Lin Wu, Hsinchu (TW)

(73) Assignee: Texas Instruments-Acer Incorporated, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/336,870

(22) Filed: Jun. 18, 1999

Related U.S. Application Data

(63) Continuation-in-part of application No. 09/036,038, filed on Mar. 6, 1998, now abandoned.

(51) Int. Cl.$^7$ .................................................. H01L 21/336
(52) U.S. Cl. ........................ 438/260; 438/261; 438/263; 438/264; 438/265
(58) Field of Search .................................... 438/264, 263, 438/265, 260, 261

(56) References Cited

U.S. PATENT DOCUMENTS

| | | | |
|---|---|---|---|
| 5,087,583 | * 2/1992 | Hazani | 437/43 |
| 5,270,226 | * 12/1993 | Hori et al. | 437/35 |
| 5,296,716 | * 3/1994 | Ovshinsky et al. | 257/3 |
| 5,406,509 | * 4/1995 | Ovshinsky et al. | 365/113 |
| 5,427,970 | * 6/1995 | Hsue et al. | 437/43 |
| 5,541,141 | * 7/1996 | Cho | 437/239 |
| 5,811,334 | * 9/1998 | Buller et al. | 438/264 |
| 5,814,543 | * 9/1998 | Nishimoto | 438/264 |
| 5,861,347 | * 1/1999 | Maiti et al. | 438/787 |
| 5,998,264 | * 12/1999 | Wu | 438/260 |
| 6,008,517 | * 12/1999 | Wu | 257/731 |

FOREIGN PATENT DOCUMENTS

2308740 * 7/1997 (GB) .

OTHER PUBLICATIONS

S. Wolf & R.N. Tauber, Silicon Processing for the VLSI Era, vol. 1, Lattice Press, pp. 177, 181, 182, 193, 195, 201, 542–585, 1986.*

\* cited by examiner

*Primary Examiner*—Olik Chaudhuri
*Assistant Examiner*—Shrinivas H. Rao

(57) ABSTRACT

The method for forming flash memory includes the following steps. At first, a semiconductor substrate with an isolation region formed upon is provided. The semiconductor substrate has a pad oxide layer and a first nitride layer formed over. A portion of the first nitride layer and of the pad oxide layer are removed to define a gate region. A first oxide layer is formed and then a sidewall structure is formed. The semiconductor substrate is doped with first type dopants. A first thermal process is performed to form a second oxide layer and drive in the first type dopants. The sidewall structure and the first nitride layer are then removed, and the first oxide layer is removed to expose a portion of the substrate under the first oxide layer. Silicon grains are formed on the pad oxide layer, the exposed portion of substrate, and the second oxide layer. The exposed portion of the substrate is then etched to leave a rugged surface on the exposed portion of the substrate. A second thermal process is performed to form a tunnel oxide layer on the rugged surface. A first conductive layer is formed over the substrate and a portion of the first conductive layer is removed to define a floating gate. A dielectric layer is formed over the semiconductor substrate and a second conductive layer is then formed over as a control gate.

20 Claims, 3 Drawing Sheets

METHOD OF FORMING HIGH DENSITY AND LOW POWER FLASH MEMORIES WITH A HIGH CAPACITIVE-COUPLING RATIO

CROSS REFERENCE TO RELATED APPLICATIONS

This is a continuation-in-part of U.S. patent application Ser. No. 09/036,038, filed Mar. 6, 1998, now abandoned.

This invention is a continuation-in-part application of an application filed under the same title of "METHOD OF FORMING HIGH DENSITY AND LOW POWER FLASH MEMORIES WITH A HIGH CAPACITIVE-COUPLING RATIO" filed at Mar. 6, 1998, which is assigned to same assignee with the same inventor as the present application.

FIELD OF THE INVENTION

The present invention relates to memory devices, and more specifically to the semiconductor fabrication process of memory devices. The invention proposes a method of forming high density and low power flash memories with a high capacitive-coupling ratio.

BACKGROUND OF THE INVENTION

Memory devices are one of the most important devices for storing of data and information. By storing data electrically in the memory devices, the data can be accessed with ultra high speed for various applications. The progress in memory device fabrication technology has made memories become a highly reliable and valuable device for a great amount of data reading and data writing access within an extremely short time. Various types of memories have been developed for a variety of applications like computation and communications systems.

An ideal storage device must have several characteristics. Numerous important applications of memory devices are specified with highly reliable and high speed operations. Low cost is needed for the explosively increasing demand on the more storage capability with a great number of storage units. High performance and high density are both important factors for performing reliable and high speed operations with least volume needed for the storage devices. Low power dissipation are highly demanded for providing longer operation time or greener operations especially for portable devices with limited capacity of power supply. Non-volatile or least refreshing characteristics is needed for both reliable, safety, and low power data storage.

Flash memory has became a valuable choice in the market of portable electrical devices and systems. High density and low power flash memories are required for future portable computer and telecommunication applications. In the article "Low Voltage NVG™: A New High Performance 3V/5V Flash Technology for Portable Computing and Telecommunications Applications" (in IEEE Transactions on Electron Devices, Vol. 43, No. 9, p. 1510, 1996), A. Bergemont et al. introduce a new concept for low voltage NOR Virtual Ground (NVG™) flash memory with a fast access time. It is mentioned that the portable telecommunications and computing market has become a major driving force in semiconductor IC (Integrated Circuits) design and technology. The growing market requires low power, high density, and electrically re-writable non-volatile memories, either embedded or stand-alone. Flash memory is another choice other than EEPROM (Electrically Erasable and Programmable ROM) because of its small size and improved reliability. New concepts and modifications of NVG™ flash memory is proposed in the work with thinner field oxide in the array to improve gate coupling of cells and result in faster programming and erase.

The capacitive-coupling ratio is a vital factor in determining the functional characteristics of the flash memory. For achieving a high density and low power flash memory, a cell structure with contactless array and high capacitive-coupling ratio have been proposed. H. Shirai et al. developed a self-aligned memory cell for 256 Mbit flash memory in 1995 (in "A 0.54 $\mu m^2$ Self-Aligned, HSG Floating Gate cell (SAHF Cell) for 256 Mbit Flash memories", in IEDM Tech. Dig., p. 653, 1995). Hemispherical-grained (HSG) polysilicon is applied to floating gate to extend the upper surface area double that of the floating gate in comparison with the conventional ones. A high capacitive-coupling ratio of 0.8 and buried $n^+$ diffusion layers which are self-aligned to the floating gate polysilicon are realized in their work.

However, a contactless array with a high capacitive-coupling ratio is difficult to be manufactured in the conventional process. Y. S. Hisamune et al. have described in the work "A High Capacitive-Coupling Ratio (HiCR) Cell for 3 V-Only 64 Mbit and Future Flash Memories" (in IEDM Tech. Dig., p.19, 1993) that a great number of total process-steps are needed for manufacturing a memory cell. The complicate process-steps in the conventional fabrication process of flash memory greatly increase the cost and efforts in achieving a high capacitive-coupling ratio.

A thinner tunnel oxide in flash memory is also recognized as an important factor to enhance the electron injection efficiency. But it is difficult to fabricate a thin tunnel oxide with a high electron injection efficiency and a large charge-to-breakdown for low power nonvolatile memories. The inventor of the present invention has reported that scaling down the thin tunnel oxide for lower voltage operation may face limitations in defect density, retention due to stress-induced leakage and charge leakage due to direct tunneling (in "Characterization of Thin Textured Tunnel Oxide Prepared by Thermal Oxidation of Thin Polysilicon Film on Silicon" by S. L. Wu et al., in IEEE Transactions on Electron Devices, Vol. 43, No. 2, p. 287, 1996). For the thicker polyoxide which uses the rough polysilicon/oxide interface as an efficient electron injector, the very large electron trapping rate and the writing-erasing memory window closing due to electron trapping will limit the memory endurance. Moreover, the reduction in thickness does not give a proportional reduction in the programming voltage because of the decrease on the electric field enhancement factor with the scaling-down of the thickness of polyoxide. The characteristics of thin textured tunnel oxide prepared by thermal oxidation of thin polysilicon film on Si substrate (TOPS) are studied in detail in the paper.

SUMMARY OF THE INVENTION

The present invention propose a method of forming flash memories. The method can provide high density and low power flash memories with a high capacitive-coupling ratio. A simpler process than the conventional process in fabricating flash memories is provided. A thin tunnel oxide is provided with increased effective area to have a raised electron injection efficiency, and a large charge-to-breakdown for low power non-volatile memories can be achieved.

The method in the present invention for forming a memory cell includes the following steps. At first, a semiconductor substrate with an isolation region formed upon is provided. The semiconductor substrate has a pad oxide layer and a first nitride layer formed over. The pad oxide layer is formed on a region uncovered by the isolation region on the semiconductor substrate. The first nitride layer formed over the pad oxide layer. A portion of the first nitride layer and of the pad oxide layer are removed to define a gate region. A first oxide layer is formed on a region uncovered by the gate region and the isolation region on the semiconductor substrate. A sidewall structure is formed on the gate region and the semiconductor substrate is doped with first type dopants. A first thermal process is performed to form a second oxide layer on a region uncovered by the sidewall structure, the gate region, and the isolation region. The first type dopants are driven in at the same time.

The sidewall structure and the first nitride layer are then removed, and the first oxide layer is removed to expose a portion of the substrate under the first oxide layer. Silicon grains are formed on the pad oxide layer, the exposed portion of the substrate, and the second oxide layer. The exposed portion of the substrate is then etched to leave a rugged surface on the exposed portion of the substrate. A second thermal process is performed to form a tunnel oxide layer on the rugged surface. Next, a first conductive layer is formed over the semiconductor substrate. A portion of the first conductive layer is removed to define a floating gate. A dielectric layer is formed over the semiconductor substrate and a second conductive layer is then formed over the semiconductor substrate as a control gate.

In addition, a step of depositing an undoped hemispherical grain (HSG) silicon film on the first conductive layer can be added after the first conductive layer is formed. The surface area of the first conductive layer as a floating gate can be significantly raised.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention proposes a method for forming flash memories. High density and low power flash memories with a high capacitive-coupling ratio can be formed. Flash memories with small area, high density, and high reliability can be achieved through a simpler process than conventional one. A large angle-tilted (LAT) ion implantation process is used to form a junction region with degraded concentration distribution in a single step. A tunnel oxide layer is grown from a rugged substrate surface to increase the effective area and improve the operating characteristics of the device. The tunnel oxide layer provides enhanced tunneling effects and raised electron injection efficiency. An undoped hemispherical grain (HSG) silicon film is formed to increase the surface area of a floating gate. High capacitive-coupling ratio is accomplished with the raised surface area. High density flash memories with low power consumption is implemented with the method disclosed in the present invention.

Figure 1:
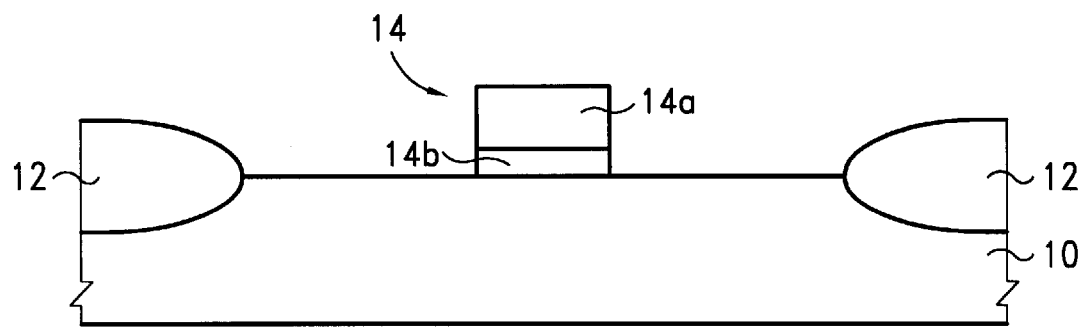
FIG. 1 illustrates a cross sectional view of a semiconductor substrate having an isolation region and a gate region defined in accordance with the present invention.

Referring to FIG. 1, a semiconductor substrate 10 is illustrated in a cross sectional view. A single crystalline silicon in a <100> direction is utilized preferably as the semiconductor substrate 10. An isolation region, like a field oxide (FOX) region 12, is formed on the semiconductor substrate 10. The formation process of the FOX region 12 are as follows. In general, a thin silicon oxide layer is thermally grown on the semiconductor substrate 10 with a thickness in the range of about 50 angstroms to 300 angstroms. A silicon nitride layer is then deposited thereon. The silicon nitride layer is utilized as a layer for inhibiting the FOX growth on an active region of the semiconductor substrate 10.

The silicon nitride layer is then patterned to etch off the region for forming the FOX. The semiconductor substrate 10 is subjected to a thermal process. As an example, a thermal process performed in a hot steam within an oxygen containing ambient is applied. A region of the silicon oxide layer uncovered by the silicon nitride layer is grown to become the FOX region 12 to serve as the isolation region shown in FIG. 1. Thus the semiconductor substrate 10, after the formation of the FOX region 12, has a pad oxide layer and a first nitride layer formed over on a region other than the FOX region 12. The isolation region on the semiconductor substrate 10 can be created through other isolation technologies which are well known in the art, like the trench isolation and so on, with the same purpose in splitting respective active regions or memory cells.

The semiconductor substrate 10 with the formation of the isolation region 12, a pad oxide layer, and a first nitride layer is provided as the starting material of the present invention. A portion of the first nitride layer and of the pad oxide layer are removed to define a gate region 14 with remained first nitride layer 14a and the remained pad oxide layer 14b, as indicated in FIG. 1. A well known pattering process can be employed to form the gate region 14. A lithography process is performed first to define the specified location and an etching process like an isotropic etching, or more specifically a plasma etching or a reactive ion etching (RIE) is applied then to form the gate region 14.

Figure 2:
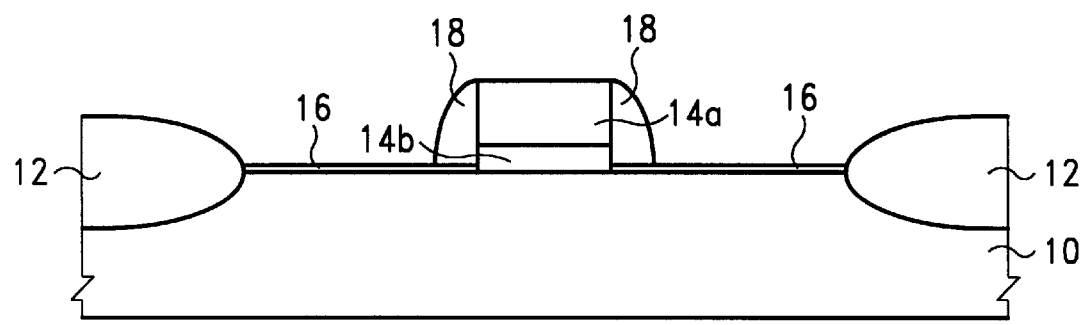
FIG. 2 illustrates a cross sectional view of forming a first oxide layer and a sidewall structure in accordance with the present invention.

Referring to FIG. 2, a first oxide layer 16 is formed on a region uncovered by the gate region 14 and the isolation region 12 on the semiconductor substrate 10. In general, the first oxide layer 16 is grown thermally from the semiconductor substrate 10 to serve as a tunnel oxide layer. The first oxide layer 16 is thermally grown in an oxygen containing ambient from the semiconductor substrate 10 with a thickness of about 20 angstroms to 1000 angstroms, as an example. A sidewall structure 18 is formed on the gate region 14. In the case, the sidewall structure 18 can be a nitride spacer structure which is frequently applied in the semiconductor manufacturing processes for its easy formation and low cost. A nitride layer is deposited on semiconductor substrate 10, and is then etched back by an anisotropic etching process to form the nitride spacer structure 18.

Figure 3:
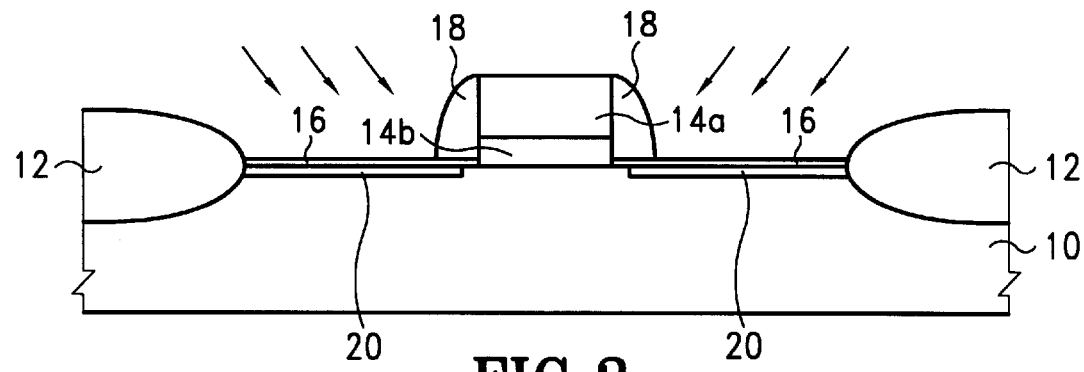
FIG. 3 illustrates a cross sectional view of doping the semiconductor substrate with first type dopants in accordance with the present invention.

A doping process is then performed with first type dopants, as shown in FIG. 3. A large angle-tilted (LAT) ion implantation process which is tilted from a vertical line at an angle between about 10 degrees to 60 degrees, is employed in the embodiment. The dopants are implanted into the semiconductor substrate 10 through the first oxide layer 16. An energy between about 10 KeV to 150 KeV is applied with a dose between about 1E14 to 5E16 atoms/cm$^2$. For forming n$^+$ diffusions, the first type dopants can be arsenic containing dopants or phosphorous containing dopants. A junction region 20 is formed under the region uncovered by the gate region 14, the sidewall structure 18, and the isolation region 12. The junction region 20 can extend further into a region under part of the sidewall structure 18 by the angle-tilted ion implantation. Thus the junction region 20 with degraded concentration distribution can be achieved by a single step.

Figure 4:
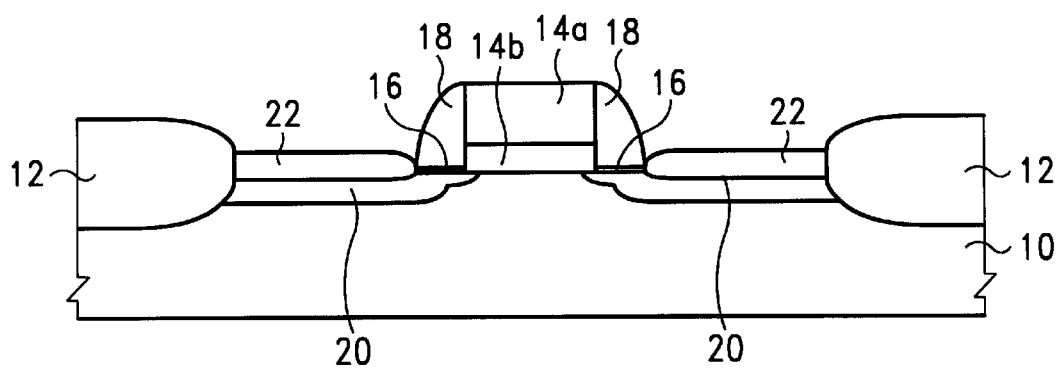
FIG. 4 illustrates a cross sectional view of performing a first thermal process to form a second oxide layer and to drive in the first type dopants in accordance with the present invention.

Referring to FIG. 4, a thermal process is performed to form a second oxide layer 22 on a region uncovered by the sidewall structure 18, the gate region 14, and the isolation region 12. The first type dopants in the junction region 20 are also diffused and driven in by the thermal process. As an example, the first thermal process can be a steam oxidation process to form the second oxide layer 22. The second oxide layer 22 is grown to have a thickness of about 300 angstroms to 1000 angstroms to serve as insulation oxide over the junction region 20. The junction region 20 formed by the large angle-tilted (LAT) ion implantation can further extends into a region under a portion of the pad oxide layer 14b by diffusion in the thermal process.

Figure 5:
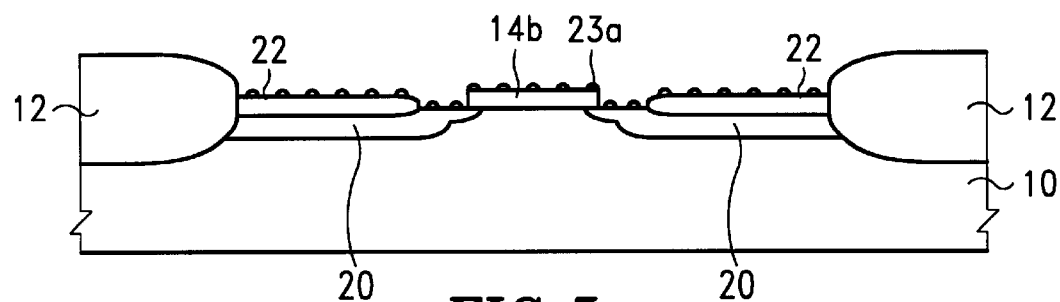
FIG. 5 illustrates a cross sectional view of removing the sidewall structure and the first nitride layer, removing the first oxide layer on the exposed substrate to expose a portion of the semiconductor substrate, and forming silicon grains on the semiconductor substrate in accordance with the present invention.

Referring to FIG. 5, the sidewall structure 18 is removed simultaneously with the first nitride layer 14a. Typical etch process like wet etch by hot phosphoric acid can be applied to remove silicon nitride. The first oxide layer 16 is then removed in order to expose a portion of the substrate 10 under the first oxide layer 16. The first oxide layer 16 can be stripped either through a plasma etch or a wet dip of oxide etchants such as hydrofluoric acid or buffered oxide etchant (BOE). Portions of the surface silicon oxide on the remained pad oxide layer 14b and the second oxide layer 22 are also removed during the etch step and their thickness is reduced, as shown in FIG. 5.

Silicon grains 23a are then formed on the surface of the substrate 10, including the pad oxide layer 14b, the exposed portion of the substrate 10, and the second oxide layer 22. The silicon grains can either be amorphous silicon deposited with typical hemispherical silicon grain (HSG) process or polysilicon deposited under high vacuum environment to provide grain-like or rugged surface of the deposited silicon.

Figure 6:
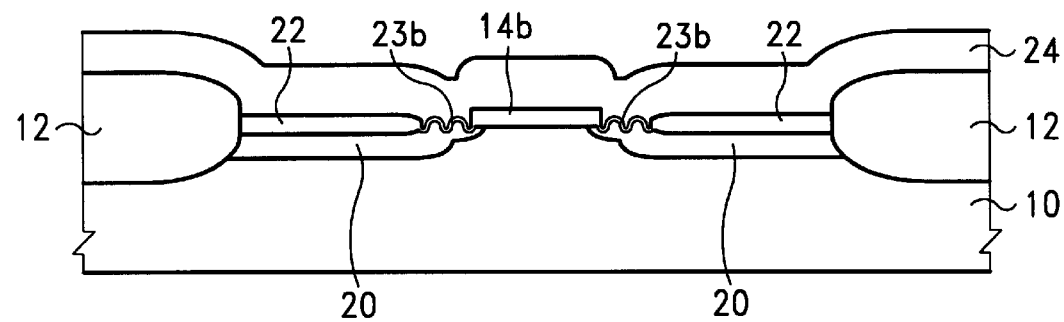
FIG. 6 illustrates a cross sectional view of etching the exposed region to leave a rugged surface, performing a second thermal process to grow a tunnel oxide layer, and forming a first conductive layer on the semiconductor substrate in accordance with the present invention.

Turning to FIG. 6, having the silicon grains 23a formed thereon, the exposed portion of the substrate 10 is etched to leave a rugged surface on the exposed portion of the substrate 10. In the preferred embodiments, two different approach can be employed to form the rugged surface of the exposed region of the substrate. The first one is by a plasma etch using the silicon grains 23a as an etching mask. The uncovered substrate 10 between grains is etched to have a plurality of recesses and thus provides the rugged surface. The second approach is to carried out the etch step with a wet etch employing hot phosphoric acid. Since the doped silicon of the substrate 10 is found to have a faster removal rate than the undoped silicon grains 23a, the uncovered substrate 10 between grains is also etched to have a plurality of recesses. Under the roughening effect of the hot phosphoric acid, the exposed silicon surface is etched to have the rugged surface. In either etch approaches, the silicon grains 23 on the pad oxide layer 14b and the second oxide layer 22 are removed in the etch step.

A second thermal process is then carried out to form a tunnel oxide layer 23b on the rugged surface, as indicated in FIG. 6. In the preferred embodiments, the second thermal process can be a steam oxidation process to form the tunnel oxide layer 23b. By forming the rugged surface of the substrate 10 under the tunnel oxide layer 23b and the thin tunnel oxide 23b by thermal oxidation, the effective area and the operating characteristics of the tunnel oxide 23b is significantly raised.

Next, a first conductive layer 24 is formed over the semiconductor substrate 10. In general, the first conductive layer 24 can be a doped polysilicon layer which is formed by chemical vapor deposition. As what is well known in the art, the doped polysilicon layer 24 can be formed by an in-situ doped chemical vapor deposition. Besides, a chemical vapor deposition of undoped polysilicon layer followed by a doping or an ion implantation process can be used alternatively in forming the doped polysilicon layer 24. For n$^+$-doped polysilicon layer, ions like phosphorous or arsenic can be utilized.

Figure 7:
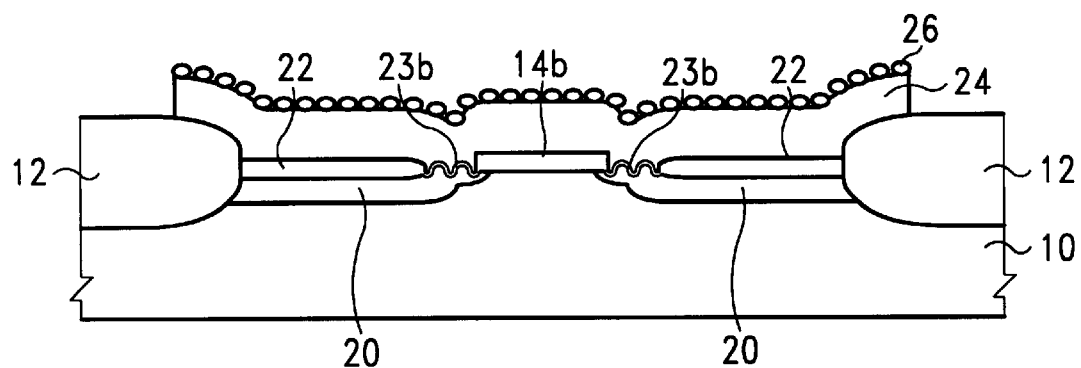
FIG. 7 illustrates a cross sectional view of depositing an undoped hemispherical grain (HSG) silicon film on the first conductive layer and of removing a portion of the first conductive layer to define a floating gate in accordance with the present invention.

To increase the surface area of the doped polysilicon layer 24 which acts as a floating gate, a step of depositing an undoped hemispherical grain (HSG) silicon film 26 can be added. Referring to FIG. 7, the undoped hemispherical grain (HSG) silicon film 26 is formed over the doped polysilicon layer 24 and thus the surface area can be raised significantly. A portion of the doped polysilicon layer 24 and the undoped hemispherical grain (HSG) silicon film 26 are then removed to define a floating gate. The portions of the doped polysilicon layer 24 and the undoped hemispherical grain (HSG) silicon film 26 which located outside the memory cell or on the isolation region 12 are removed or etched off.

Figure 8:
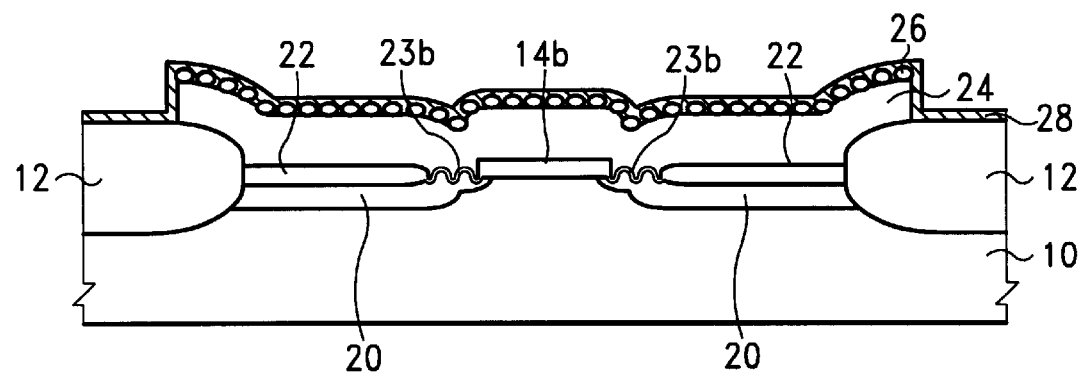
FIG. 8 illustrates a cross sectional view of forming a dielectric layer over the semiconductor substrate in accordance with the present invention.

Referring to FIG. 8, a dielectric layer 28 is then formed over the semiconductor substrate 10 abutting to the top surface of the doped polysilicon layer 24 and the undoped hemispherical grain (HSG) silicon film 26. The dielectric layer 28 can be a nitride layer or an oxynitride layer. The dielectric layer 28 is deposited over the semiconductor substrate 10 with an ultra-thin thickness of about 30 angstroms to about 250 angstroms. To enhance the quality of the dielectric layer 28, an annealing step can be performed in a nitrogen and oxygen containing ambient. The quality of the nitride layer or the oxynitride layer can be increased with a N$_2$O annealing in the embodiment.

Figure 9:
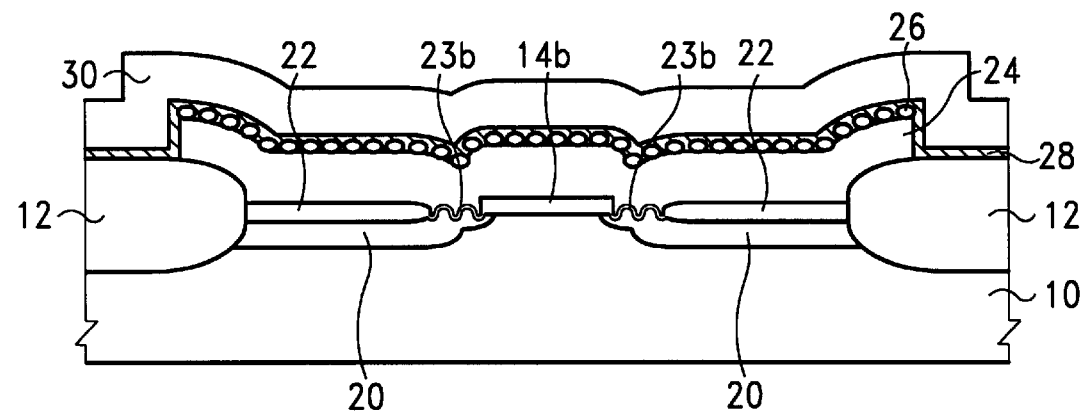
FIG. 9 illustrates a cross sectional view of forming a second conductive layer over the semiconductor substrate in accordance with the present invention.

Finally, a second conductive layer 30 is formed over the semiconductor substrate 10 to act as a control gate and finish the formation of flash memories, as shown in FIG. 9. In the same way as the first conductive layer 24, the second conductive layer 30 can be a doped polysilicon layer which is formed by chemical vapor deposition. The doped polysilicon layer 30 can be formed by an in-situ doped chemical vapor deposition. Besides, a chemical vapor deposition of undoped polysilicon layer followed by a doping or an ion implantation process can be employed alternatively in forming the doped polysilicon layer 30. For n+-doped polysilicon layer, ions like phosphorous or arsenic can be utilized.

The present invention propose a method for forming flash memories. High density and low power flash memories with a high capacitive-coupling ratio can be formed with a simpler process than conventional one. The capacitive-coupling ratio in this structure is larger than the conventional ones. The raised surface area of the floating gate and the increased quality of the dielectric layer are the main issue. The electron injection efficiency of the tunnel oxide could be enhanced by the approach of forming rugged shape in the present invention. High density flash memories with low power consumption is implemented with the method disclosed in the present invention.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for forming a memory cell, said method comprising the steps of:

providing a semiconductor substrate with an isolation region formed upon said semiconductor substrate, said semiconductor substrate having a pad oxide layer and a first nitride layer formed over said semiconductor substrate, said pad oxide layer formed on a region not covered by said isolation region on said semiconductor substrate, and said first nitride layer formed over said pad oxide layer;

removing a portion of said first nitride layer and of said pad oxide layer to define a gate region;

forming a first oxide layer on a region not covered by said gate region and said isolation region on said semiconductor substrate;

forming a sidewall structure on said gate region;

doping said semiconductor substrate with first type dopants;

performing a first thermal process to form a second oxide layer on a region not covered by said sidewall structure, said gate region, and said isolation region, and to drive in said first type dopants;

removing said sidewall structure and said first nitride layer;

removing said first oxide layer to expose a portion of said substrate under said first oxide layer;

forming silicon grains on said pad oxide layer, said portion of said substrate, and said second oxide layer;

etching said portions of said substrate to leave a rugged surface on said portion of said substrate;

performing a second thermal process to form a tunnel oxide layer on said rugged surface;

forming a first conductive layer over said semiconductor substrate;

removing a portion of said first conductive layer to define a floating gate;

forming a dielectric layer over said semiconductor substrate; and forming a second conductive layer over said semiconductor substrate.

2. The method of claim 1 further comprising a step of depositing an undoped hemispherical grain (HSG) silicon film on said first conductive layer after said first conductive layer is formed.

3. The method of claim 1, wherein said sidewall structure comprises a nitride spacer structure, which is formed by depositing and etching back a second nitride layer on said semiconductor substrate.

4. The method of claim 1, wherein said step of doping said first type dopants is performed with a large angle-tilted (LAT) ion implantation process at an angle between about 10 degrees to 60 degrees.

5. The method of claim 1, wherein said first type dopants are implanted with an energy between about 10 KeV to 150 KeV at a dose between about 1E14 to 5E16 atoms/cm$^2$, said first type dopants are arsenic containing dopants or phosphorous containing dopants.

6. The method of claim 1, wherein said first thermal process is a steam oxidation process to form said second oxide layer.

7. The method of claim 1, wherein said etching step to etch said portion of said substrate is a plasma etch using said silicon grains as an etching mask.

8. The method of claim 1, wherein said etching step to etch said portion of said substrate is a wet etch by phosphoric acid.

9. The method of claim 1, wherein said first conductive layer comprises a doped polysilicon layer which is formed by chemical vapor deposition.

10. The method of claim 1, wherein said dielectric layer comprises a nitride layer or an oxynitride layer which is deposited over said semiconductor substrate.

11. The method of claim 10 further comprising a step of annealing said dielectric layer in a nitrogen and oxygen containing ambient after the formation of said dielectric layer.

12. The method of claim 1, wherein said second conductive layer comprises a doped polysilicon layer which is formed by chemical vapor deposition to serve as a control gate.

13. A method for forming a memory cell, said method comprising the steps of:

providing a semiconductor substrate with an isolation region formed upon said semiconductor substrate, said semiconductor substrate having a pad oxide layer and a first nitride layer formed over said semiconductor substrate, said pad oxide layer formed on a region not covered by said isolation region on said semiconductor substrate, and said first nitride layer formed over said pad oxide layer;

removing a portion of said first nitride layer and of said pad oxide layer to define a gate region;

forming a first oxide layer on a region not covered by said gate region and said isolation region on said semiconductor substrate;

forming a sidewall structure on said gate region;

doping said semiconductor substrate with first type dopants by a large angle-tilted (LAT) ion implantation process at an angle between about 10 degrees to 60 degrees;

performing a first thermal process to form a second oxide layer on a region not covered by said sidewall structure, said gate region, and said isolation region, and to drive in said first type dopants;

removing said sidewall structure and said first nitride layer;

removing said first oxide layer to expose a portion of said substrate under said first oxide layer;

forming silicon grains on said pad oxide layer, said portion of said substrate, and said second oxide layer;

etching said portions of said substrate to leave a rugged surface on said portion of said substrate;

performing a second thermal process to form a tunnel oxide layer on said rugged surface;

forming a first conductive layer over said semiconductor substrate;

depositing an undoped hemispherical grain (HSG) silicon film on said first conductive layer;

removing a portion of said undoped hemispherical grain (HSG) silicon film and of said first conductive layer to define a floating gate;

forming a dielectric layer over said semiconductor substrate; and forming a second conductive layer over said semiconductor substrate.

14. The method of claim 13, wherein said sidewall structure comprises a nitride spacer structure, which is formed by depositing and etching back a second nitride layer on said semiconductor substrate.

15. The method of claim 13, wherein said first type dopants are implanted with an energy between about 10 KeV to 150 KeV at a dose between about 1E14 to 5E16 atoms/$cm^2$, said first type dopants are arsenic containing dopants or phosphorous containing dopants.

16. The method of claim 13, wherein said first thermal process is a steam oxidation process to form said second oxide layer.

17. The method of claim 13, wherein said etching step to etch said portion of said substrate is a plasma etch using said silicon grains as an etching mask.

18. The method of claim 13, wherein said etching step to etch said portion of said substrate is a wet etch by phosphoric acid.

19. The method of claim 13, wherein said first conductive layer and said second conductive layer comprise doped polysilicon layers which are formed by chemical vapor deposition.

20. The method of claim 13 further comprising a step of annealing said dielectric layer in a $N_2O$ containing ambient.

* * * * *